United States Patent
Li et al.

(10) Patent No.: US 8,923,044 B2
(45) Date of Patent: Dec. 30, 2014

(54) MTP MTJ DEVICE

(75) Inventors: Xia Li, San Diego, CA (US); Kangho Lee, San Diego, CA (US); Jung Pill Kim, San Diego, CA (US); Taehyun Kim, San Diego, CA (US); Wah Nam Hsu, San Diego, CA (US); Seung H. Kang, San Diego, CA (US); Xiaochun Zhu, San Diego, CA (US); Wei-Chuan Chen, Taipei (TW); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 103 days.

(21) Appl. No.: 13/589,426

(22) Filed: Aug. 20, 2012

(65) Prior Publication Data
US 2014/0048894 A1    Feb. 20, 2014

(51) Int. Cl.
| | |
|---|---|
| G11C 11/14 | (2006.01) |
| G11C 17/16 | (2006.01) |
| H01L 27/22 | (2006.01) |
| G11C 11/16 | (2006.01) |
| H01L 43/02 | (2006.01) |
| H01L 43/12 | (2006.01) |

(52) U.S. Cl.
CPC ............ H01L 43/12 (2013.01); G11C 17/165 (2013.01); H01L 27/222 (2013.01); G11C 11/1675 (2013.01); G11C 11/1693 (2013.01); H01L 43/02 (2013.01)
USPC .......................................... 365/171; 365/148

(58) Field of Classification Search
CPC ............ G11C 17/165; G11C 11/1675; G11C 11/1693
USPC ............ 365/97, 96, 100, 148, 158, 163, 171, 365/173
See application file for complete search history.

(56) References Cited

U.S. PATENT DOCUMENTS

| | | | |
|---|---|---|---|
| 6,324,093 B1 | 11/2001 | Perner et al. | |
| 6,483,734 B1 * | 11/2002 | Sharma et al. | 365/97 |
| 6,768,150 B1 | 7/2004 | Low et al. | |
| 8,054,706 B2 * | 11/2011 | Goldman et al. | 365/209 |
| 2008/0094886 A1 * | 4/2008 | Ranjan et al. | 365/171 |
| 2010/0328992 A1 | 12/2010 | Kano et al. | |
| 2012/0033490 A1 | 2/2012 | Rao et al. | |
| 2012/0320656 A1 * | 12/2012 | Chung | 365/96 |

FOREIGN PATENT DOCUMENTS

EP        1450406 A1    8/2004

OTHER PUBLICATIONS

International Search Report—PCT/US2013/055175—ISA/EPO—Dec. 11, 2013.
Takayuki, et al., "2 Mb SPRAM (Spin-Transfer Torque RAM) With Bit-by-Bit Bi-Directional Current Write and Parallelizing-Direction Current Read", IEEE Journal of Solid-State Circuits, vol. 43, No. 1, Jan. 2008; pp. 109-120.

*Primary Examiner* — Gene Auduong
(74) *Attorney, Agent, or Firm* — Donald D. Min

(57) ABSTRACT

Systems and methods for multiple-time programmable (MTP) devices. An MTP device includes a magnetic tunnel junction (MTJ) device programmable to a plurality of states based on voltage applied across the MTJ device. The plurality of states include a first resistance state corresponding to a first binary value stored in the MTJ device based on a first voltage, a second resistance state corresponding to a second binary value stored in the MTJ device based on a second voltage, a third resistance state corresponding to a breakdown of a barrier layer of the MTJ device based on a third voltage, and a fourth resistance state corresponding to an open fuse based on a fourth voltage.

31 Claims, 9 Drawing Sheets

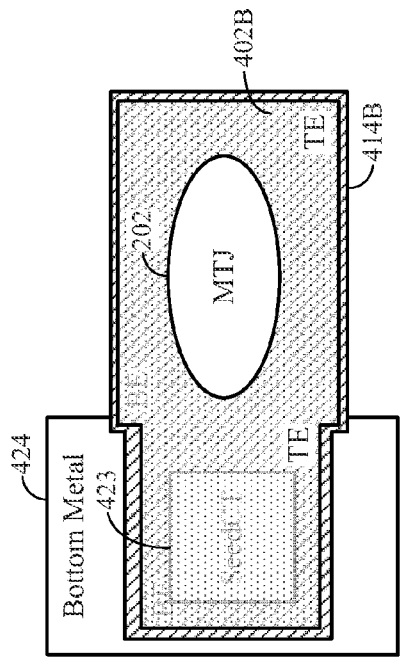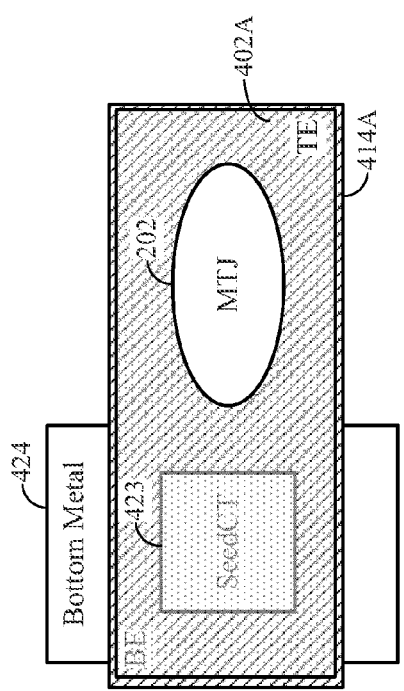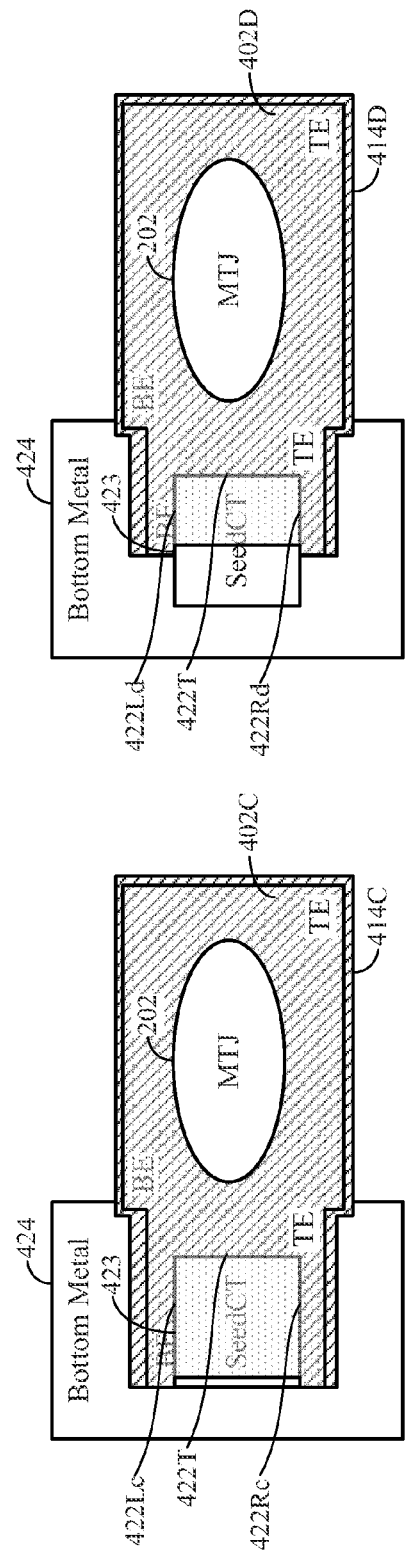
FIG. 5A  FIG. 5B  FIG. 5C  FIG. 5D

MTP MTJ DEVICE

FIELD OF DISCLOSURE

Disclosed embodiments are directed to programmable semiconductor devices. More particularly, exemplary embodiments are directed to multiple-time programmable (MTP) devices including magnetic tunnel junction (MTJ) devices which can be programmed to resistance states such as, first and second binary value storage states, short-circuit (anti-fuse) state and open-circuit (fuse) state.

BACKGROUND

Design of integrated circuits involves integration of various circuit components on a semiconductor die. Integrated circuit components may include logical and memory elements, electrical components such as resistors, capacitors, inductors, etc. Frequently the need arises for functionality such as variable resistance, fuses, short-circuits, etc, in the design of these integrated, circuits. Conventionally, such need is answered by separate components for each of these functionalities. However, with shrinking device sizes and need for low cost integration solutions, design and integration of these various different components is expensive and inefficient due to limited real estate on semiconductor dies. This problem is exacerbated by associated design and test costs.

Magnetic storage elements such as MTJs are emerging in the industry as a smaller and faster alternative to conventional memory elements using electric charge. Magnetoresistive Random Access Memory (MRAM) is a non-volatile memory technology that uses magnetic elements. For example, Spin Transfer Torque Magnetoresistive Random Access Memory (STT-MRAM) uses electrons that become spin-polarized as the electrons pass through a thin film (spin filter).

FIG. 1 illustrates a conventional STT-MRAM bit cell 100. STT-MRAM bit cell 100 includes magnetic tunnel junction (MTJ) storage element 105, transistor 101, bit line 102 and word line 103. MTJ 105 is formed, for example, from at least two ferromagnetic layers (a pinned layer and a free layer), each of which can hold a magnetic field or polarization, separated by a thin non-magnetic insulating layer (tunneling harrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through MTJ storage element 105 will vary depending on the alignment of the polarizations of the pinned and free layers. This variance in resistance can be used to program and read STT-MRAM bit cell 100. STT-MRAM bit cell 100 also includes source line 104, sense amplifier 108, read/write circuitry: bipolar write pulse/read bias generator 106 and bit line reference 107. Those skilled in the art will appreciate the operation and construction of STT-MRAM bit cell 100 is provided merely as an example.

As can be seen, MTJ storage element 105 can exhibit at least the two resistance values based on respective alignment of the pinned layer and the free layer. However, in conventional integrated circuits, MTJ elements such as MTJ storage element 105 fail to find application outside their role as storage elements. More specifically, existing solutions do not extend MTJ elements for use in other circuit components such as variable resistance devices, short-circuit elements, fuses, etc. As a result, existing solutions involve expensive reuse and redundancy to realize these various circuit components.

Accordingly, there is a need in the art for multiple-time programmable devices which can be programmed and configured for reuse in order to realize the various circuit functionalities in a single device.

SUMMARY

Exemplary embodiments of the invention are directed to systems and method for multiple-time programmable (MTP) devices including magnetic tunnel junction (MTJ) devices which can be programmed to resistance states such as, first and second binary value storage states, short-circuit (anti-fuse) state and open-circuit (fuse) state.

For example, an exemplary embodiment is directed to a method of forming a multiple-time programmable (MTP) device comprising: initializing a state of a magnetic tunnel junction (MTJ) device to a first resistance state, increasing a voltage applied across the MTJ device to transition the state to a second resistance state, and increasing the voltage applied across the MTJ device to transition the state to a third resistance state corresponding to a breakdown of a barrier layer of the MTJ device. The method further comprises increasing the voltage applied across the MTJ device to transition the state to a fourth resistance state corresponding to an open fuse.

Another exemplary embodiment is directed to a method of configuring an MTJ device comprising: altering a voltage applied across the MTJ device, such that the MTJ device is programmed to one of a plurality of states, the plurality of states comprising: a first resistance state corresponding to an anti-parallel alignment of a free layer and a pinned layer of the MTJ device, a second resistance state corresponding to a parallel alignment of the free layer and the pinned layer of the MTJ device, a low resistance anti-fuse state corresponding to a breakdown of a barrier layer of the MTJ device, and a high resistance open fuse state.

Yet another exemplary embodiment is directed to a method of configuring an MTJ device comprising: altering a voltage applied across the MTJ device, such that the MTJ device is programmed to one of a plurality of states, the plurality of states comprising: a first resistance state corresponding to a parallel alignment of a free layer and a pinned layer of the MTJ device, a second resistance state corresponding to an anti-parallel alignment of the free layer and the pinned layer of the MTJ device, a low resistance anti-fuse state corresponding to a breakdown of a barrier layer of the MTJ device, and a high resistance open fuse state.

Another exemplary embodiment is directed to a multiple-time programmable (MTP) device comprising: a magnetic tunnel junction (MTJ) device programmable to a plurality of states, the plurality of states comprising: a first resistance state corresponding to a first binary value stored in the MTJ device based on a first voltage applied across the MTJ device, a second resistance state corresponding to a second binary value stored in the MTJ device based on a second voltage applied across the MTJ device, and a third resistance state corresponding to a breakdown of a barrier layer of the MTJ device based on a third voltage applied across the MTJ device. A fourth resistance state corresponds to an open fuse based on a fourth voltage applied across the MTJ device.

Another exemplary embodiment is directed to a system comprising: a programmable means with a plurality of states, the plurality of states comprising: a first state corresponding to a first binary value stored in the programmable means based on a first voltage applied across the programmable means, a second state corresponding to a second binary value stored in the programmable means based on a second voltage applied across the programmable means, and a third state corresponding to a short circuit based on a third voltage applied across the programmable means. The system further comprises a fourth state corresponding to an open fuse based on a fourth voltage applied across the programmable means.

Another exemplary embodiment is directed to a method of forming a multiple-time programmable (MTP) device comprising: step for initializing a state of a magnetic tunnel junction (MTJ) device to a first resistance state, step for increasing a voltage applied across the MTJ device to transition the state to a second resistance state, and step for increasing the voltage applied across the MTJ device to transition the state to a third resistance state corresponding to a breakdown of a barrier layer of the MTJ device. The method further comprises step for increasing the voltage applied across the MTJ device to transition the state to a fourth resistance state corresponding to an open fuse.

BRIEF DESCRIPTION OF THE DRAWINGS

The accompanying drawings are presented to aid in the description of embodiments of the invention and are provided solely for illustration of the embodiments and not limitation thereof.

FIGS. 5A-H illustrate top views of exemplary layouts of an exemplary MTJ device.

DETAILED DESCRIPTION

Figure 1:
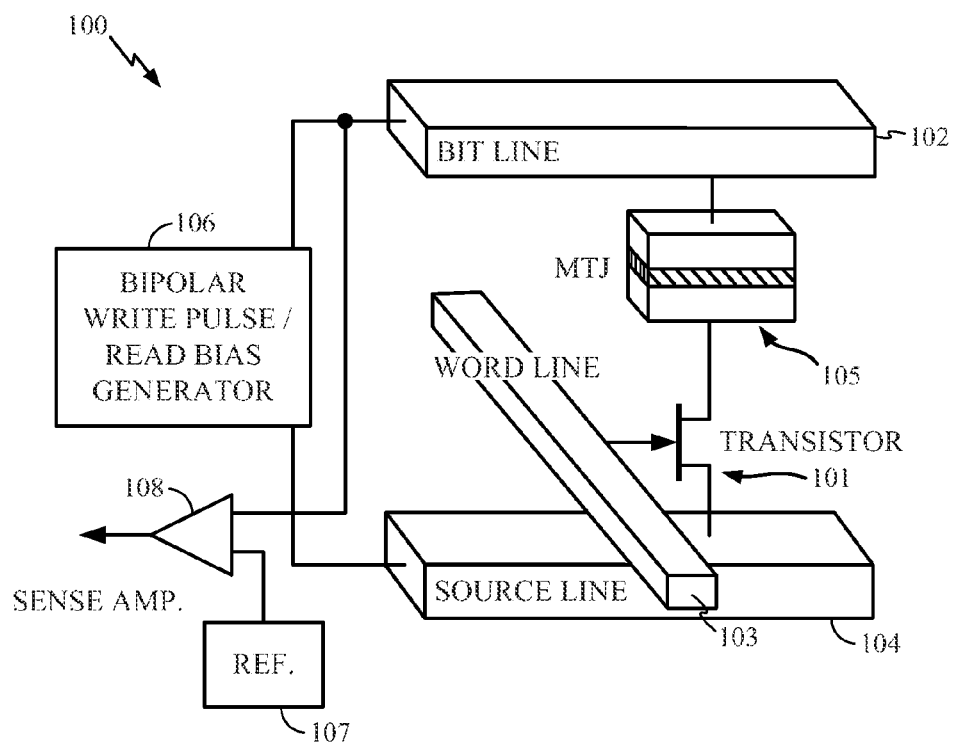
FIG. 1 illustrates a conventional STT-MRAM bit cell 100.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to techniques for configuring MTJ devices as programmable components with a plurality of states, such as resistance states. Exemplary MTJ devices can be configured to achieve such programmability by varying an applied, voltage across the MTJ devices. Additionally, in some embodiments, the fabrication of exemplary MTJ devices may be suitably modified from fabrication of conventional MTJ devices in order to support the programmable nature of exemplary MTJ devices. In this disclosure, a multiple-time programmable (MTP) device refers to a device which may be configured to exist in a plurality of states. For example, a two-time programmable (TTP) device is an MTP device which may be programmed to display one of two states. MTP devices may be configured as a resistor with two or more resistance values, an anti-fuse device, or a fuse.

Figure 2A:
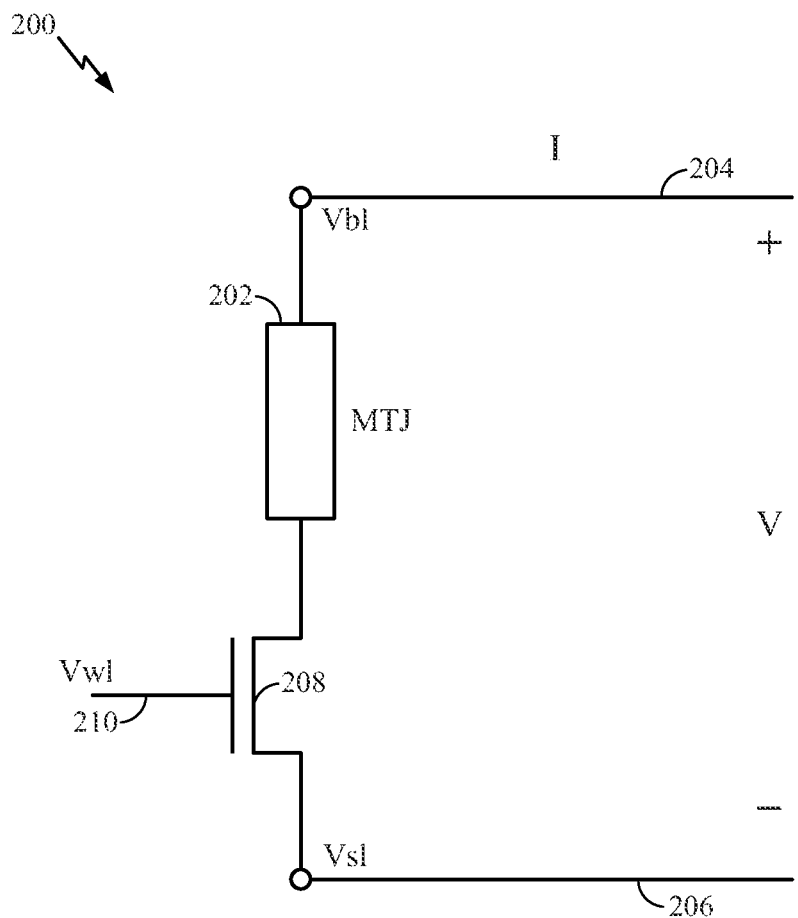
FIG. 2A illustrates an exemplary circuit 200 for forming an MTP device comprising an exemplary MTJ device.
Figure 4A:
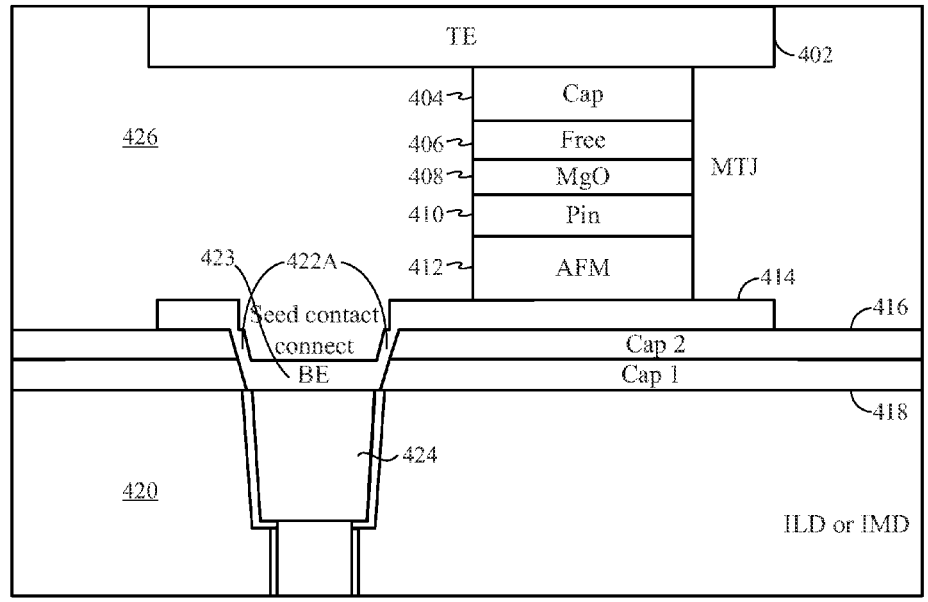
FIGS. 4A-B illustrate cross-sectional views of exemplary device-level structures of an exemplary MTJ device.
Figure 4B:
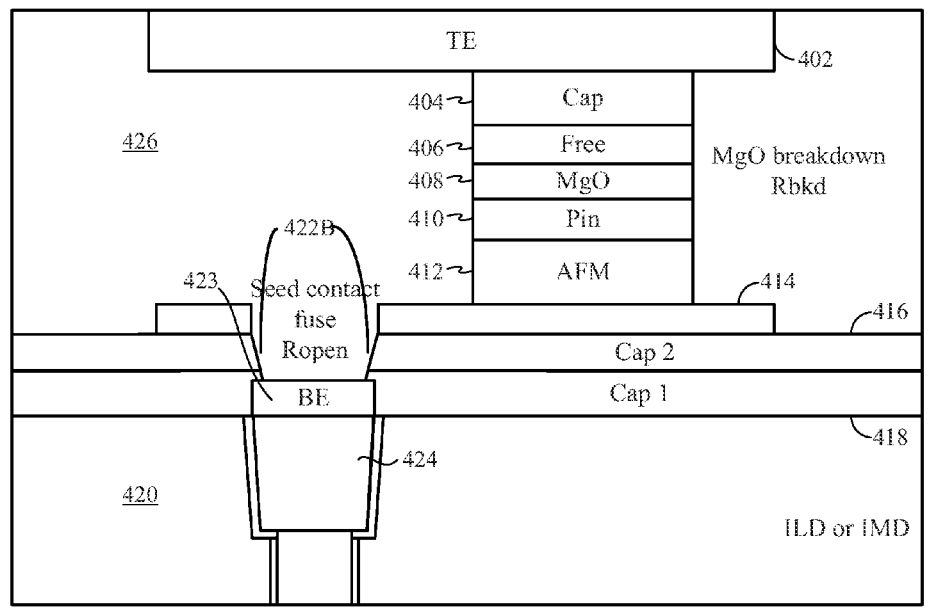
Figure 5E:
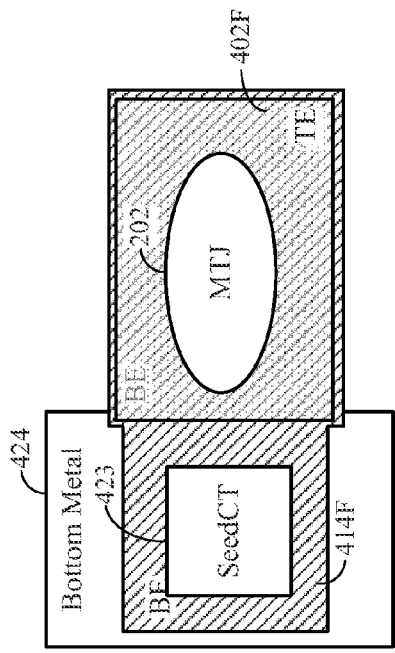
Figure 5F:
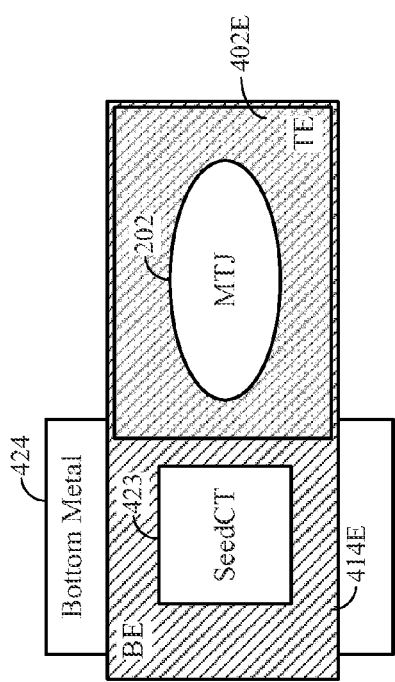
Figure 5G:
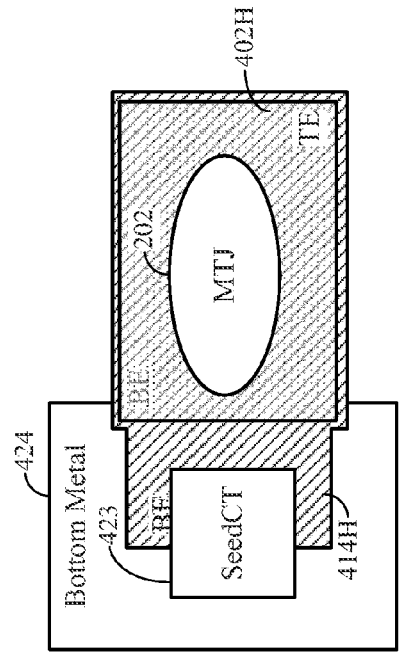
Figure 5H:
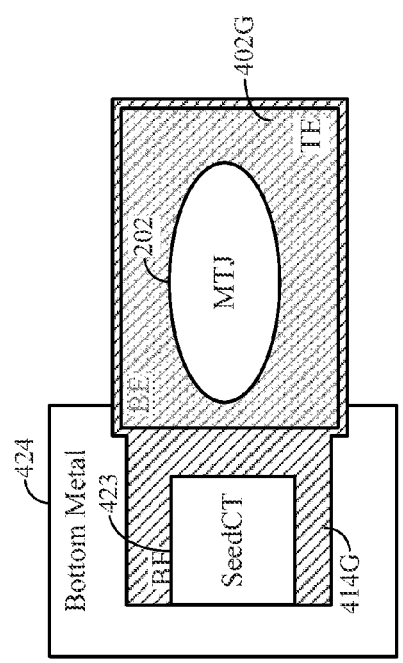

With reference now to FIG. 2A, exemplary circuit 200 comprising a storage cell, MTJ 202 is illustrated. While the detailed structure of MTJ 202 is not illustrated in FIG. 2A, a more detailed description will be provided with reference to FIGS. 4A-B. It will be understood that exemplary embodiments may relate to at least two different configurations of MTJ 202. The detailed description will be provided with respect to a first configuration of MTJ 202 (e.g. as illustrated in FIGS. 4A-B) comprising a free layer on the top, closest to a top electrode and a pinned layer at the bottom, closest to a bottom electrode. A second configuration may be the reverse, with the free layer at the bottom, closest to the bottom electrode and the pinned layer at the top, closest to the top electrode. Skilled persons will recognize that voltage values that will be described with regard to the first configuration will be reversed with regard to the second configuration. Thus, the detailed description for the first configuration can be easily extended to the second configuration by reversing the voltage applied to 202.

Returning to FIG. 2A, the illustrated MTJ 202 is assumed to be of the first configuration. MTJ 202 is coupled to bit line 204 and to source line 206 through transistor 208. As shown, circuit 200 may be deployed, for example, in a memory array. By controlling the voltage applied to word line 210 which is coupled to the gate of transistor 208, transistor 208 may be turned off or on. MTJ 202 may then be read or written by controlling bit line 204 and source line 206 according to known memory access techniques comprising read/write circuitry and sense amplifiers which have been described with reference to FIG. 1. In exemplary embodiments, MTJ 202 may be further configured as an MTP device in the following manner.

With combined reference to FIGS. 2A-B, a first embodiment of configuring MTJ 202 as an MTP device will be described. In an initial state, a binary value of "1" may be written to MTJ 202 by activating word line 210 and appropriately transferring a value of "1" from a specific writing current of bit line 204 and source line 206. This "1" value held in MTJ 202 may correspond to an anti-parallel or misaligned orientation between the pinned layer and free layer of MTJ 202. Accordingly, this initial state corresponds to an anti-parallel resistance value, Rap and is designated by state 250 in FIG. 2B, which illustrates a graph of voltage V (x-axis) appearing across MTJ 202 via bit line 204 and source line 206, and the resistance across MTJ 202 (y-axis).

Once state 250 is established in MTJ 202, in exemplary embodiments, MTJ 202 may be programmed to one of states 252, 254, or 256 in the following manner by varying voltage V. For example, in a first transition 251 from state 250 to state 252, voltage V may be increased, for example, by increasing the voltage of bit line 204 and coupling source line 206 to ground. State 252 corresponds to a parallel resistance Rp appearing across MTJ 202 (which corresponds to storing, a binary value "0" in MTJ 202). Transition 251 is reversible, and MTJ 202 may be programmed back to resistance Rap by reversing voltage V and current appropriately.

In exemplary embodiments, MTJ 202 may be further configured as an anti-fuse device by continuing to increase voltage V. As shown in FIG. 2B, continuing to increase voltage V beyond state 252 can program MTJ 202 to state 254 in a second transition 253. State 254 corresponds to a breakdown of the tunneling barrier of MTJ 202. Effectively, this state corresponds to a short circuit or very low resistance appearing across MTJ 202. It is also referred to as an anti-fuse state or MgO breakdown state based on the commonly used material, MgO, for forming the tunneling barrier. Transition 253 is irreversible.

Voltage V may be further increased to achieve a third transition 255 from state 254 to 256. State 256 corresponds to a connection to the bottom electrode of MTJ 202 being eroded due to high electrical migration (EM) stress created by the large current flowing across MTJ 202, thus leading to an open circuit. In other words, state 256 corresponds to an open fuse with a very large resistance value. Transition 255 is also irreversible.

Accordingly, by varying voltage V, MTJ 202 may be programmed to one of the four states, states 250 and 252 corresponding to anti-parallel and parallel resistance values Rap and Rp respectively, state 254 corresponding to low break down resistance anti-fuse, and state 256 corresponding to high resistance open fuse. Fabrication of exemplary MTJ 202 to efficiently achieve these states and the transitions in between.

Once again, it will be recalled that the above operation of MTJ 202 by varying voltage V is described with regard to MTJ 202 in the first configuration with the free layer on top and the pinned layer in the bottom. As previously mentioned, a similar operation may be achieved for MTJ 202 in the second configuration with the free layer in the bottom and the pinned layer on top, by simply reversing the voltage value from V to negative V (−V) and substantially following the same process outlined above for the first configuration. It will be understood that by increasing negative V in the second configuration, the first and second states will be the reverse of the first configuration. In other words, if voltage negative V is applied to MTJ 202 configured in the second configuration, the first state (such as state 250 in FIG. 2B) will correspond to a parallel resistance Rp state, in contrast to the illustration of FIG. 2B. As negative V is increased, the second state (such as state 252 of FIG. 2B) will correspond to an anti-parallel resistance Rap state, in contrast to the illustration of FIG. 2B. The third and fourth states will be similar to the first configuration, namely the anti-fuse state (such as state 254 of FIG. 2B) and the open fuse state (such as state 256 of FIG. 2B) respectively.

Figure 2B:
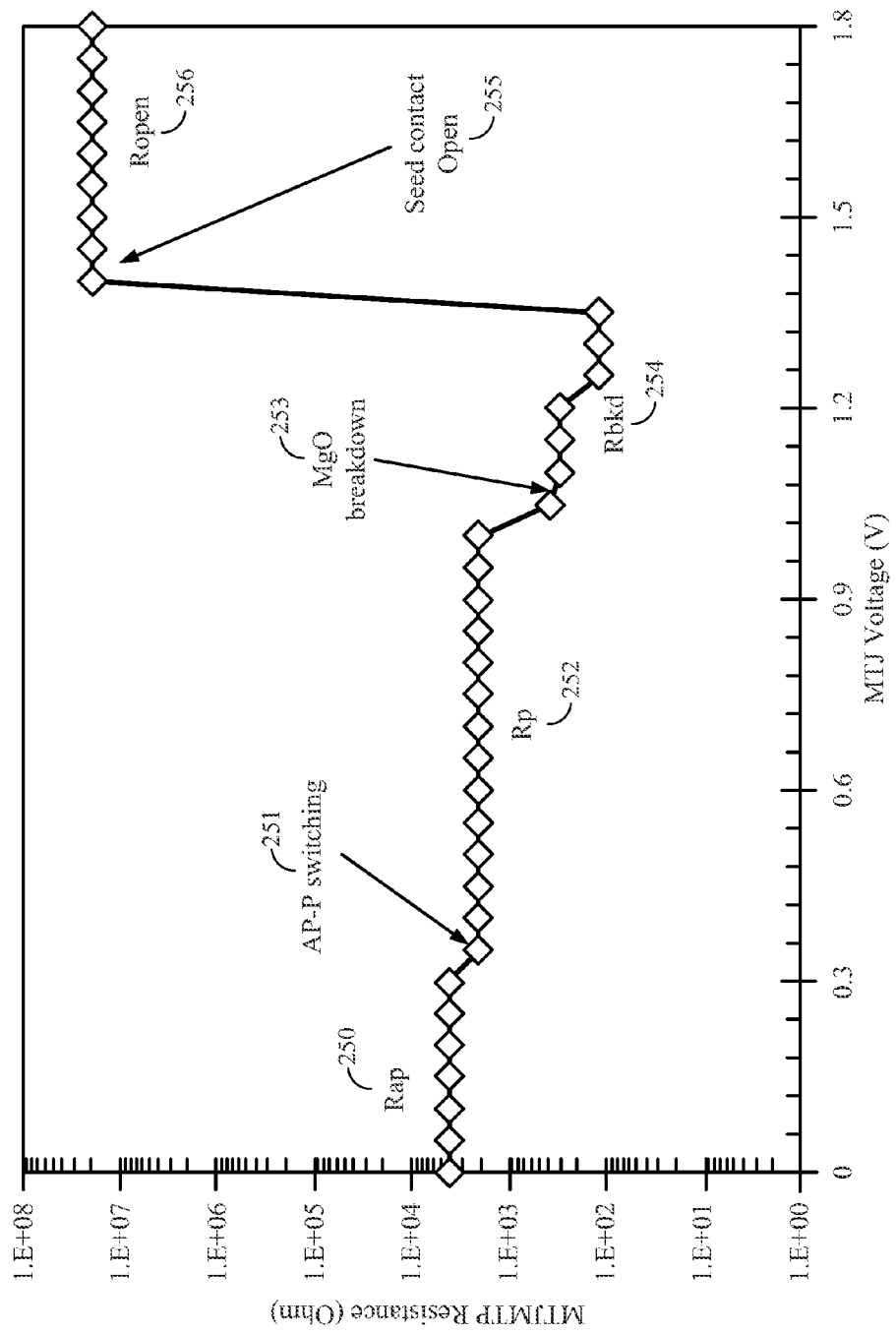
FIGS. 2B-C illustrate states and transitions in between for a first and second embodiment of configuring an exemplary MTJ device as a MTP device.
Figure 2C:
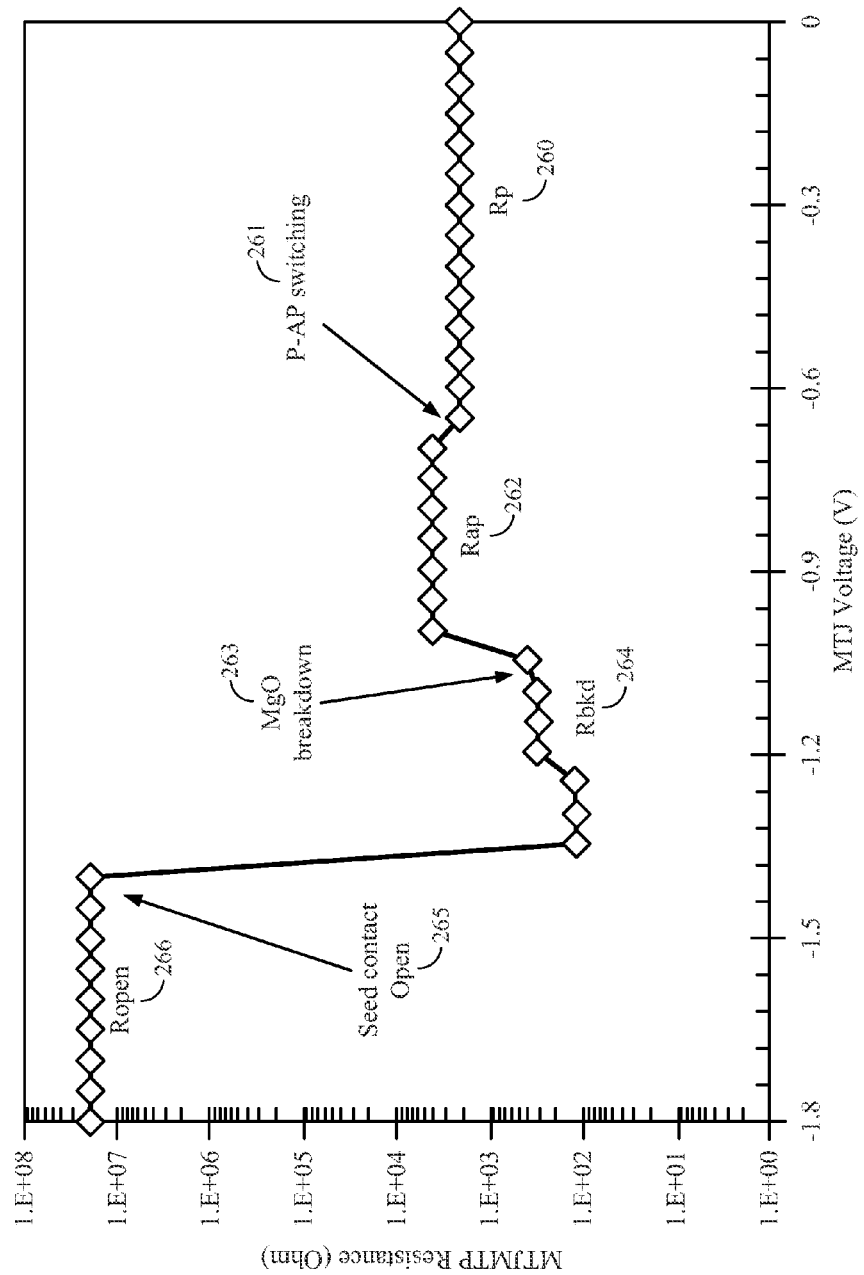

Referring now to FIG. 2C, four states and in-between transitions corresponding to a second embodiment of programming MTJ 202 as an MTP device is illustrated. Once again, this description will be based on MTJ 202 configured in the first configuration. FIG. 2C is similar to FIG. 2B, with the initial state and direction of voltage V reversed. Accordingly, in FIG. 2C, MTJ 202 is initially programmed to store a value "0" with resistance Rp in state 260. The voltages of bit line 204 and source line 206 are reversed with regard to voltages illustrated in FIG. 2B, and thus, on the x-axis, a negative voltage V (−V) is illustrated in FIG. 2C. By increasing this negative voltage V, reversible transition 261 configures MTJ 202 to state 262 with resistance Rap, which also corresponds to binary value "1". Further increasing negative voltage V causes irreversible transition 263 to state 264 which corresponds to a low resistance anti-fuse state or breakdown of the MgO/tunneling barrier. Finally, a further increase in negative voltage V causes irreversible transition 265 to state 266 corresponding to a high resistance open fuse.

Once again, as previously described, the above operation outlined for MTJ 202 in the first configuration with regard to FIG. 2C, can be extended to MTJ 202 in the second configuration by reversing the voltage value from negative V to positive V. It will also be understood that in the second configuration, the first and second states as positive V is increased from the initial value would correspond to anti-parallel resistance Rap state and parallel resistance Rp state respectively, while the third and fourth states will correspond to the anti-fuse state and open fuse states respectively.

Figure 3:
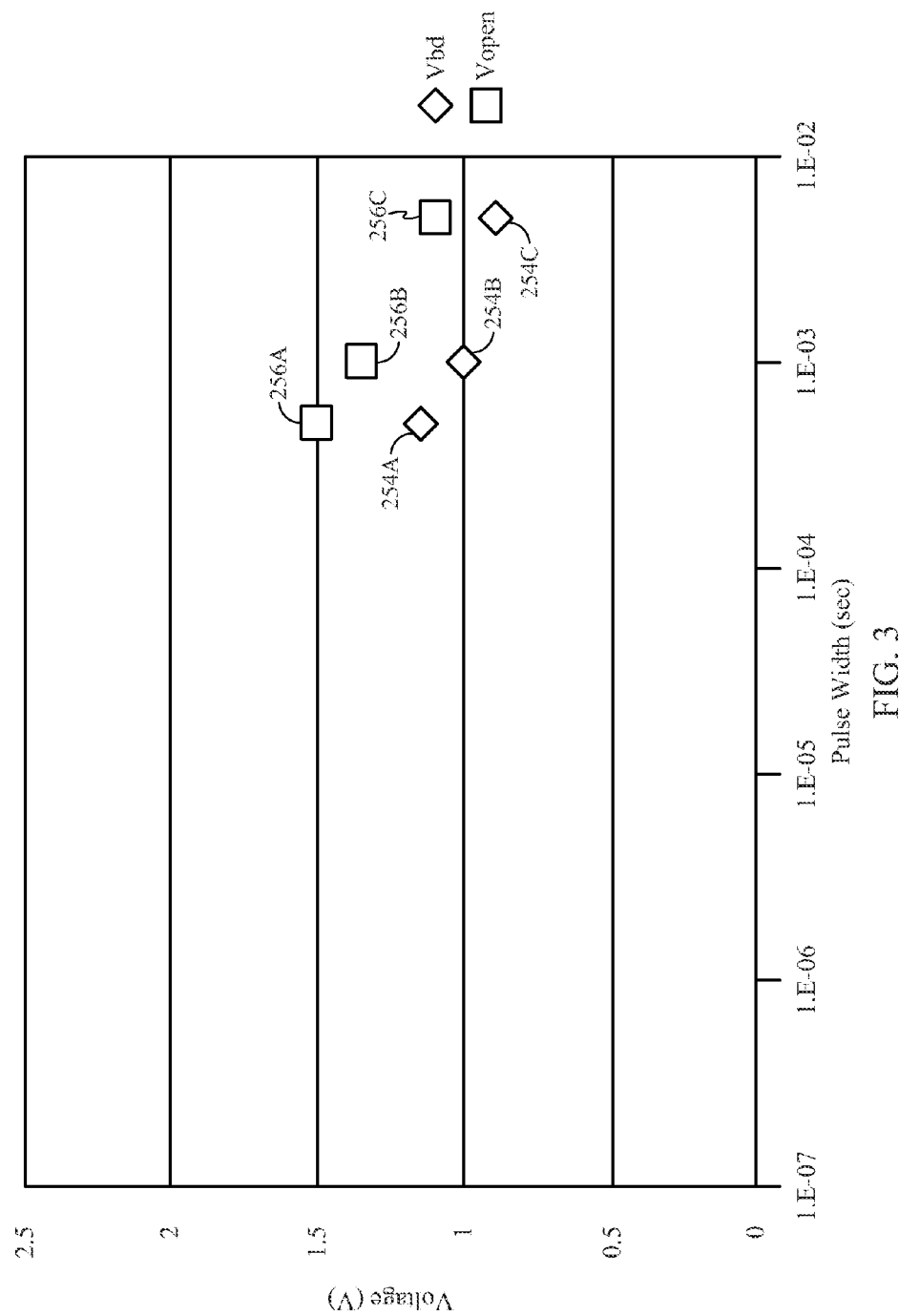
FIG. 3 illustrates an exemplary graphical relationship between a pulse width and voltage value applied to an exemplary MTJ device.

While the voltage transitions illustrated in FIGS. 2B-C have been described above in terms of a monotonic or continuous variation, the voltage values may be applied, as pulses to MTJ 202 in order to achieve the desired programmable states. For example, with reference to FIG. 3, an exemplary graph illustrating the relationship between a pulse width and voltage value to achieve each of states anti-fuse 254 and open fuse 256 in FIG. 2B is illustrated. The sample points 256A-C correspond to voltage value Vopen for achieving open fuse state 256 of MTJ 202, while the sample points 254-C correspond to voltage value Vbd for achieving anti-fuse state 254 of MTJ 202. As can be seen from these sample points, a shorter pulse width requires a higher voltage value for both Vopen as well as Vbd. With this relationship between pulse width and required voltage value for programming MTJ 202, pulse widths can be controlled to improve yield of MTJ devices configured from MTJ 202. In one example, these pulse widths may be controlled by suitably modifying a logic unit such as bipolar write pulse/read bias generator 106 shown in FIG. 1.

For the above described states in FIGS. 2B-C, in some embodiments, it is possible to achieve resistance values Rap and Rp across MTJ 202 in the range of 6K and 3K ohms in the states 250 and 252 of FIG. 2B (or in the reverse configuration of FIG. 2C, states 260 and 262). As described, transitions between these two resistance states are reversible. In the anti-fuse states 254 and 264, resistance (Rbkd) values may be as low as 300 ohms, while in the open fuse states 256 and 266, resistance (Ropen) values may be as high as 10M ohms.

With reference now to FIGS. 4A-B, a cross-sectional view of an exemplary device-level structure of MTJ 202 is illustrated. As shown, MTJ 202 may be fabricated on a layer of a semiconductor die which has been generally designated as 426. The body of MTJ 202, commonly known as the MTJ stack, may comprise the sub-layers: cap layer 404, free layer 406, tunneling barrier (MgO) layer 408, pinned layer 410, and anti-ferromagnetic layer 412. As previously noted, this illustrated configuration corresponds to the first configuration. The second configuration (not illustrated) can be achieved by forming pinned layer 410 on top of tunneling barrier layer 408 and free layer 406 on the bottom of tunneling barrier layer 408. Some other variations of MTJ implementations may include variations of the depicted MTJ stack, for example, in perpendicular MTJ implementations an anti-ferromagnetic layer may not be present. Skilled persons will recognize suitable implementations of MTJ 202. As shown, MTJ 202 is coupled to top electrode 402 and bottom electrode 414. Two diffusion barrier cap layers 418 and 416 may be formed on inter-layer dielectric to separate layer 426 from the bottom layer which has been generally designated as 426. Seed contact 423 may be formed in cap layers 416/418. Metal lines in bottom metal 424 in lower layer 420 may be coupled to bottom electrode 414 through seed contact 423 and seed contact sidewalls 422A.

For the resistance states Rap and Rp (e.g. states 250 and 252 of FIG. 2B, or 262 and 260 of FIG. 2C), the layers of MTJ 202 may correspond to the structure illustrated in FIG. 4A. MTJ 202 may be used as a storage device for storing binary values of 0 and 1 and associated resistance values Rp and Rap will appear across MTJ 202. A tunnel magnetoresistance effect (TMR effect) defined by the formula (Rap−Rp)/Rp is a measurement of change in resistance between the Rap and Rp states. The TMR effect relates to the amount of current required to transition between the Rap and Rp states. Based on the TMR effect, transitions between these states can be achieved by varying the voltage applied across MTJ 202, for example, through the top electrode 402 and bottom metal 424 respectively. When the voltage applied is increased to the breakdown voltage, MTJ 202 may enter the anti-fuse state (e.g. 254 or 264). In the anti-fuse state, the tunneling barrier layer (MgO) 408 breaks down and current can flow across MTJ 202 via top and bottom electrodes 402 and 414 with very low resistance offered in the current path.

As the applied voltage is increased further, MTJ 202 can enter the open fuse (e.g. 256 or 266) state as described. In this open fuse state, the structure of MTJ 202 can be as shown in FIG. 4B. A high current corresponding to the high applied voltage flows through MTJ 202, given the very low resistance offered by the tunneling barrier layer (MgO) 408 because of the breakdown of the barrier layer in the anti-fuse state. This high current flowing through bottom electrodes 414 builds up a high EM stress on seed contact sidewalls that were designated as 422A in FIG. 4A. The metal contacts in these sidewalls begin to erode until finally they are fully eroded leading to open contacts 422B of FIG. 4B. The open contacts 422B effectively cut off the current path from bottom metal 424 and seed contact 423 to bottom electrode 414, thus leading to the open fuse state of MTJ 202.

The efficiency of above-described exemplary MTP devices configured from MTJ 202 may be improved by modifying the structure of MTJ 202 described in FIGS. 4A-B. For example, by modifying the structure and layout of bottom electrode 414, erosion of metal in contact sidewalls 422A may be expedited in order to achieve the open contacts 422B while transitioning from the anti-fuse state to open fuse state of MTJ 202. Current crowding effect, which relates to density of current flowing through the metal area, may be exploited in expediting this erosion process.

With reference now to FIGS. 5A-D, top views of exemplary layouts of MTJ 202 are illustrated. More particularly, these illustrated embodiments are directed to selected layouts of electrode layers for optimizing transitions between states such as the anti-fuse state and the open fuse state. In FIGS. 5A-D, top electrode 402A-D is depicted to be on the top layer and of a shape and size substantially similar to and aligned with bottom electrode 414A-D. Also shown are the MTJ stack of MTJ 202, seed contact 423, and bottom metal 424.

Turning now to FIG. 5A, a layout substantially corresponding to the cross-sectional view illustrated in FIGS. 4A-B is illustrated. Top electrode 402A and bottom electrode 414A are shown to have the same amount of coverage over the MTJ stack of MTJ 202 as well as seed contact 423. Accordingly, the same mask may be used to both define top and bottom electrodes 402A and 414A. This is a basic embodiment.

In FIG. 5B, an improvement is illustrated wherein the coverage of top electrode 402B and bottom electrode 414B over seed contact 423 are reduced with regard to that of the coverage over the MTJ stack of MTJ 202. By virtue of this reduced coverage, particularly of bottom electrode 414B, over seed contact 423, current crowding effect is seen in the sidewall contacts 422A of FIG. 4A. Therefore, the density of current flowing through these sidewall contacts is much higher, particularly during the transition from the anti-fuse state to the open fuse state, leading to a faster erosion of the sidewalls due to the increased current crowding.

A further improvement is illustrated in FIG. 5C, wherein the coverage of top electrode 402C and bottom electrode 414C over seed contact 423 is further reduced, to the point that only sidewall portions designated by 422Lc, 422T, and 422Rc of seed contact 423 are in contact with bottom electrode 414C. This may lead to a much faster erosion of the sidewalk, because opening of the sidewalls (422B of FIG. 4B) is substantially related to only these sidewall portions 422Lc, 422T, and 422Rc. This improvement is further developed in the embodiment of FIG. 5D, wherein coverage of top electrode 402D and bottom electrode 414D over seed contact 423 is further reduced such that only sidewall portions designated by 422Ld, 422T, and 422Rd of seed contact 423 are in initial contact with bottom electrode 414D (it can be seen that 422Ld and 422Rd are of smaller dimension than 422Lc and 422Rc). Thus only sidewall portions 422Ld, 422T, and 422Rd will need to be opened during the transition from anti-fuse state to open fuse state, thus further expediting the process.

FIGS. 5E-H illustrate embodiments which are respectively similar to the above described embodiments illustrated in FIGS. 5A-D, with the notable difference that layout optimizations are more focused on bottom electrode coverage over seed contact 423. These embodiments of FIGS. 5E-H take into account that top electrode coverage and layout may differ from that of the bottom electrode. Coverage of top electrode 402E-H in FIGS. 5E-H is substantially the same, and limited to covering the MTJ stack 202, without extending to seed contact 423. On the other hand, bottom electrodes 414E-H substantially correspond to bottom electrodes 414A-D respectively, and their shapes and layouts are optimized for expedited erosion of sidewalls of seed contact 423 in a similar manner as described above with regard to bottom electrodes 414A-D.

Accordingly, it can be seen that in exemplary embodiments, the MTP MTJ device may be configured as an anti-fuse device by breakdown of the tunneling barrier, and as an open fuse based on opening the sidewalls of the seed contact by using electrical migration. Exemplary embodiments can include MTJ devices formed as in-plane structures as well as vertical/perpendicular MTJ structures. As will be recognized by one of ordinary skill in the art, in-plane MTJ structures relate to configurations wherein orientations of the corresponding free layer and pinned layer are in the same horizontal plane such that they are either parallel or anti-parallel (depending on the stored binary value), with regard to the horizontal plane. In vertical/perpendicular MTJ structures, the corresponding free layer and pinned layer are oriented perpendicular to the horizontal plane in which they are formed. Accordingly, the free layer and pinned layer in vertical/perpendicular MTJ structures are either parallel or anti-parallel (depending on the stored binary value), with regard to the vertical/perpendicular plane. Skilled persons will recognize techniques for configuring exemplary MTJ devices as MTP devices according to exemplary embodiments by appropriately controlling the voltage applied to the exemplary MTJ devices based on whether they are formed as in-plane or vertical/perpendicular structures.

Figure 6:
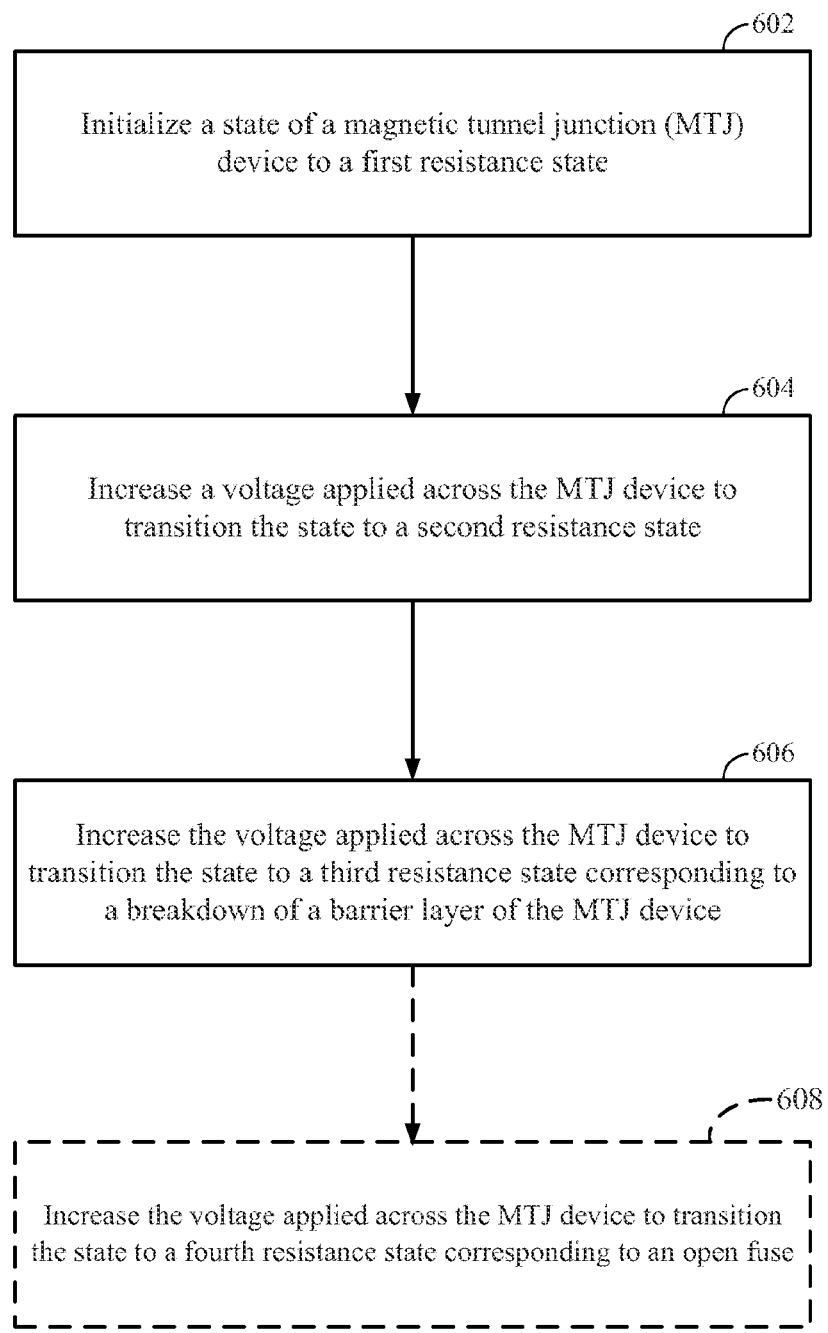
FIG. 6 is a flowchart depiction of a method of forming a multiple-time programmable (MTP) device according to exemplary embodiments.

It will be appreciated that embodiments include various methods for performing the processes, functions and/or algorithms disclosed herein. For example, as illustrated in FIG. 6, an embodiment can include a method of forming a multiple-time programmable (MTP) device comprising: initializing a state of a magnetic tunnel junction (MTJ) device (e.g. MTJ 202) to a first resistance state (e.g. Rap 250)—Block 602; increasing a voltage (e.g. V) applied across the MTJ device to transition (e.g. 251) the state to a second resistance state (e.g. Rp 252)—Block 604; and increasing the voltage applied across the MTJ device to transition (e.g. 253) the state to a third resistance state (e.g. anti-fuse 254) corresponding to a breakdown of a tunneling barrier layer (e.g. 408) of the MTJ device—Block 606. Additionally, the method may further comprise increasing the voltage applied across the MTJ device to transition (e.g. 255) the state to a fourth resistance state (e.g. open fuse 256) corresponding to an open fuse— Block 608.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described, in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a multiple-time programmable (MTP) device. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of forming a multiple-time programmable (MTP) device comprising:
   initializing a state of a magnetic tunnel junction (MTJ) device to a first resistance state;
   increasing a voltage applied across the MTJ device to transition the state to a second resistance state; and
   increasing the voltage applied across the MTJ device to transition the state to a third resistance state corresponding to a breakdown of a barrier layer of the MTJ device.

2. The method of claim 1, wherein:
   the MTJ device is in a first configuration with a free layer closest to a top electrode and a pinned layer closest to a bottom electrode;
   the voltage is a positive value;
   the first resistance state corresponds to an anti-parallel alignment of the free layer and the pinned layer; and
   the second resistance state corresponds to a parallel alignment of the free layer and the pinned layer of the MTJ device.

3. The method of claim 1, wherein:
   the MTJ device is in a second configuration with a free layer closest to a bottom electrode and a pinned layer closest to a top electrode;
   the voltage is a negative value;
   the first resistance state corresponds to a parallel alignment of the free layer and the pinned layer; and
   the second resistance state corresponds to an anti-parallel alignment of the free layer and the pinned layer of the MTJ device.

4. The method of claim 1, wherein:
   the MTJ device is in a first configuration with a free layer closest to a top electrode and a pinned layer closest to a bottom electrode;
   the voltage is a negative value;
   the first resistance state corresponds to a parallel alignment of the free layer and the pinned layer; and
   the second resistance state corresponds to an anti-parallel alignment of the free layer and the pinned layer of the MTJ device.

5. The method of claim 1, wherein:
   the MTJ device is in a second configuration with a free layer closest to a bottom electrode and a pinned layer closest to a top electrode;

the voltage is a positive value;
the first resistance state corresponds to an anti-parallel of the free layer and the pinned layer; and
the second resistance state corresponds to a parallel alignment of the free layer and the pinned layer of the MTJ device.

6. The method of claim 1 further comprising:
increasing the voltage applied across the MTJ device to transition the state to a fourth resistance state corresponding to an open fuse.

7. The method of claim 6, wherein the voltage is a high voltage, and sidewalls of a seed contact coupling the seed contact to a bottom electrode of the MTJ device are eroded by high electrical migration (EM) effect created by high current flowing through the MTJ device due to the high voltage, in order to create an open circuit.

8. The method of claim 7 further comprising modifying a layout of the bottom electrode to reduce contact of the bottom electrode with the sidewalls of the seed contact in order to increase a current crowding effect on the sidewalls and expedite the high electrical migration (EM) effect.

9. The method of claim 6, wherein the transition to the fourth resistance state is irreversible.

10. The method of claim 1, wherein the transition from the first resistance state to the second resistance state is reversible.

11. The method of claim 1, wherein the transition to the third resistance state is irreversible.

12. The method of claim 1, wherein the MTJ device is configured as an in-plane MTJ.

13. The method of claim 1, wherein the MTJ device is configured as a perpendicular MTJ.

14. The method of claim 1, wherein the voltage applied across the MTJ device is a pulse, and wherein a width of the pulse is inversely proportional to a desired magnitude of the voltage.

15. A method of configuring an MTJ device comprising:
altering a voltage applied across the MTJ device, such that the MTJ device is programmed to one of a plurality of states, the plurality of states comprising:
a first resistance state corresponding to an anti-parallel alignment of a free layer and a pinned layer of the MTJ device;
a second resistance state corresponding to a parallel alignment of the free layer and the pinned layer of the MTJ device;
a low resistance anti-fuse state corresponding to a breakdown of a barrier layer of the MTJ device; and
a high resistance open fuse state.

16. A method of configuring an MTJ device comprising:
altering a voltage applied across the MTJ device, such that the MTJ device is programmed to one of a plurality of states, the plurality of states comprising:
a first resistance state corresponding to a parallel alignment of a free layer and a pinned layer of the MTJ device;
a second resistance state corresponding to an anti-parallel alignment of the free layer and the pinned layer of the MTJ device;
a low resistance anti-fuse state corresponding to a breakdown of a barrier layer of the MTJ device; and
a high resistance open fuse state.

17. A multiple-time programmable (MTP) device comprising:
a magnetic tunnel junction (MTJ) device programmable to a plurality of states, the plurality of states comprising:
a first resistance state corresponding to a first binary value stored in the MTJ device based on a first voltage applied across the MTJ device;
a second resistance state corresponding to a second binary value stored in the MTJ device based on a second voltage applied across the MTJ device; and
a third resistance state corresponding to a breakdown of a barrier layer of the MTJ device based on a third voltage applied across the MTJ device.

18. The MTP device of claim 17, wherein the plurality of states of the MTJ device further comprises a fourth resistance state corresponding to an open fuse based on a fourth voltage applied across the MTJ device.

19. The MTP device of claim 18, wherein:
the MTJ device is constructed from a first configuration with a free layer closest to a top electrode and a pinned layer closest to a bottom electrode;
the first, second, third, and fourth voltages are positive, and fourth voltage is greater than the third voltage, the third voltage is greater than the second voltage, and the second voltage is greater than the first voltage;
the first resistance state corresponds to an anti-parallel alignment of the free layer and the pinned layer and the first binary value is "1"; and
the second resistance state corresponds to a parallel alignment of the free layer and the pinned layer and the second binary value is "0".

20. The MTP device of claim 18, wherein:
the MTJ device is constructed from a second configuration with a pinned layer closest to a top electrode and a free layer closest to a bottom electrode;
the first, second, third, and fourth voltages are negative, and fourth voltage is greater than the third voltage, the third voltage is greater than the second voltage, and the second voltage is greater than the first voltage;
the first resistance state corresponds to a parallel alignment of the free layer and the pinned layer and the first binary value is "0"; and
the second resistance state corresponds to an anti-parallel alignment of the free layer and the pinned layer and the second binary value is "1".

21. The MTP device of claim 18, wherein the fourth voltage is a high voltage configured to cause high current to flow through the MTJ device and erode one or more sidewalls coupling a seed contact to a bottom electrode of the MTJ device based on high electrical migration (EM) effect.

22. The MTP device of claim 21, wherein a layout of the bottom electrode is configured to reduce contact of the bottom electrode with the one or more sidewalls of the seed contact in order to increase a current crowding effect on the one or more sidewalls and expedite the high EM effect.

23. The MTP device of claim 17 integrated in at least one semiconductor die.

24. The MTP device of claim 17 integrated into a device selected from the group consisting of a set top box, music player, video player, entertainment unit, navigation device, communications device, personal digital assistant (PDA), fixed location data unit, and a computer.

25. A system comprising:
a programmable means with a plurality of states, the plurality of states comprising:
a first state corresponding to a first binary value stored in the programmable means based on a first voltage applied across the programmable means;
a second state corresponding to a second binary value stored in the programmable means based on a second voltage applied across the programmable means; and a third state corresponding to a short circuit based on a third voltage applied across the programmable means.

26. The system of claim 25, wherein the plurality of states of the programmable means further comprise a fourth state corresponding to an open fuse based on a fourth voltage applied across the programmable means.

27. The system of claim 26, wherein the programmable means comprises a magnetic tunnel junction (MTJ) device.

28. The system of claim 27, wherein the fourth voltage is a high voltage configured to cause high current to flow through the MTJ device and erode one or more sidewalls coupling a seed contact to a bottom electrode of the MTJ device based on high electrical migration (EM) effect.

29. The system of claim 28, wherein a layout of the bottom electrode is configured to reduce contact of the bottom electrode with the one or more sidewalls of the seed contact in order to increase a current crowding effect on the one or more sidewalls and expedite the high EM effect.

30. A method of forming a multiple-time programmable (MTP) device comprising:
   step for initializing a state of a magnetic tunnel junction (MTJ) device to a first resistance state;
   step for increasing a voltage applied across the MTJ device to transition the state to a second resistance state; and
   step for increasing the voltage applied across the MTJ device to transition the state to a third resistance state corresponding to a breakdown of a barrier layer of the MTJ device.

31. The method of claim 30 further comprising:
   step for increasing the voltage applied across the MTJ device to transition the state to a fourth resistance state corresponding to an open fuse.

* * * * *